(12) United States Patent
Masenas et al.

(10) Patent No.: US 6,525,615 B1
(45) Date of Patent: Feb. 25, 2003

(54) OSCILLATOR WITH DIGITALLY VARIABLE PHASE FOR A PHASE-LOCKED LOOP

(75) Inventors: Charles J. Masenas, Essex Junction, VT (US); Troy A. Seman, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/617,259

(22) Filed: Jul. 14, 2000

(51) Int. Cl.[7] .................................................. H03L 7/08
(52) U.S. Cl. .............................. 331/34; 331/45; 331/57; 331/74; 331/1 A; 360/51; 327/159; 327/161
(58) Field of Search .......................... 331/34, 1 A, 45, 331/57, 74, 17; 327/159, 161; 360/51

(56) References Cited

U.S. PATENT DOCUMENTS

| | | | |
|---|---|---|---|
| 5,302,920 A | 4/1994 | Bitting | 331/45 |
| 5,564,089 A | 10/1996 | Barrett, Jr. | 331/177 R |
| 5,598,364 A | 1/1997 | McCall et al. | |
| 5,638,010 A | 6/1997 | Adams | 327/105 |
| 5,727,038 A | 3/1998 | May et al. | 375/376 |
| 5,757,238 A | 5/1998 | Ferraiolo et al. | 331/16 |
| 5,905,388 A | 5/1999 | Van Der Valk et al. | 327/107 |
| 5,909,149 A | 6/1999 | Bath et al. | 331/2 |
| 6,114,914 A | * 9/2000 | Mar | 331/16 |

OTHER PUBLICATIONS

A Semidigital Dual Delay–Locked Loop, IEEE Journal of Solid–State Circuits, vol. 32, No. 11, Nov. 1997, pp. 1683–1692.
IEEE Journal of Solid–State Circuits, vol. 34, No. 12, Dec. 1999, pp. 1951–1960.

* cited by examiner

*Primary Examiner*—Arnold Kinkead
(74) *Attorney, Agent, or Firm*—DeLio & Peterson LLC; Kelly M. Reynolds; Richard A. Henkler

(57) ABSTRACT

The present invention provides an improved method and apparatus for independently controlling phase and frequency using an oscillator having a plurality of stages in combination with a phase selector within a digitally controlled phase-locked loop, preferably, a read phase locked loop. The present invention provides a digitally controlled variable phase of the read timing loop in read channel integrated circuits associated with data storage devices. The phase selector has a digitally controlled fine interpolator with 12 states for further fine interpolation between at least two multiplexer phase outputs to provide a single phase output selected from a range comprising at least $2\pi$ in selectable variable phase increments of $2\pi/96$ radian. The combined oscillator with the phase selector within a phase locked loop controls phase by exact fractional increments of equally space phases of the operating frequency within the phase locked loop, therein controlling phase at all operating frequencies.

13 Claims, 3 Drawing Sheets

OSCILLATOR WITH DIGITALLY VARIABLE PHASE FOR A PHASE-LOCKED LOOP

BACKGROUND OF THE INVENTION

1. Field of the Invention

The present invention relates generally to phase and frequency control. More particularly, it relates to a method and apparatus for controlling phase and frequency using an oscillator in combination with a phase selector within a digitally controlled phase-locked loop.

2. Description of Related Art

Typically, read channel integrated circuits associated with data storage devices, such as magnetic hard disk drives, have two modes of operation for controlling the system clock: a write mode having a write loop and a read mode having a read loop. In the write loop, the system clock is synthesized from an external reference clock, such as the output of a crystal oscillator. The synthesized frequency is typically a rational multiple, N/D (where N and D are integers), of the reference clock. Frequency synthesis is a well known technique in the art. In the write loop of the timing control loop, specified data is obtained and written to a magnetic medium at this synthesized frequency, one binary bit of data per cycle. Furthermore, in such loop, phase errors are typically measured by a phase-frequency detector (PFD).

In the second loop of operation for controlling the system clock, the read loop, data is read from the magnetic medium at the same rate it was written. In the read loop, the system clock is aligned in phase and frequency to the data stream read from the magnetic medium. Typically, the continuous time signals from the magnetic medium are captured by a sample and hold circuit (S/H) timed by the system clock. The phase and frequency of the system clock are controlled by such discrete samples through the feedback control in the read loop. Furthermore, the read loop timing itself has two modes of operation, acquisition and tracking. The acquisition mode occurs prior to the reading of actual data and is characterized by high gain and wide band to rapidly synchronize to the phase of the incoming data stream. The tracking mode must also have wide bandwidth but gain is normally reduced to avoid spurious phase disturbances.

Using known techniques (Sidiropoulos et al., "A Semi Digital Delay-Locked Loop", IEEE Journal of Solid-State Circuits, Vol. 32, No. 11, November 1997) 2N phase outputs of an N stage delay-locked loop (DLL) can be used to produce one phase output interpolated between any two adjacent phases from among the 2N phases. Sidiropoulos et al. show a scheme for digitally changing phase in increments of $27\pi/192$ with a phase range of $2\pi$ radians by utilizing a delay line. The Sidiropoulos scheme requires both ends of such delay line to be phase aligned to the reference clock, thus requiring a separate control loop. In Sidiropoulos, a 6 stage delay line produces phase steps of $2\pi/12$ radians, or coarse 30 degree phase steps, and a phase interpolator produces 16 fine steps for each of the 12 coarse steps. Furthermore, a phase detector and charge pump are used to accomplish the phase locking in the Sidiropoulos scheme.

Generally, since the read and write control loops are not active simultaneously, common elements may be shared between the two control loops. Such common elements include, for example, a Current Controlled Oscillator (ICO), a Voltage Controlled Oscillator (VCO), a filter capacitor, a Voltage to Current (V to I) circuit, Charge Pumps, and the like.

In a phase-locked loop (PLL) phase is typically controlled by a filter having a resistor in series with a capacitor to produce a filter having one pole. However, since integrated circuits typically do not have linear resistive elements adequate for producing resistor elements for filters, a Proportional-Integral-Derivative (PID) Control may alternatively be used to control phase. Generally, integrated circuits employ a Proportional-Integral (PI) control by having two signal paths, one called a proportional path and one called an integral path. The proportional path has a gain, $K_p$, independent of frequency. The integral path has gain, $K_I/s$, where s is the LaPlace variable. Therein, the sum of the proportional and integral path is $K_p+K_I/s$. As such, the PI signals mimic the resistor in series with a capacitor of a filter having $K_p/K_I$ pole.

Generally, the prior art discloses indirectly controlling phase by controlling frequency of an oscillator. Such phase controllers typically control phase by controlling frequency. However, in a digitally controlled phase locked loop, the gain of the closed loop varies with operating frequency, and thus controlling phase indirectly by controlling the frequency is not optimum. Therefore, improvements are needed in controlling phase in a digitally controlled PLL, as well as controlling phase and frequency independently of each other. Additionally, further improvements are needed in selecting and outputting a fine phase in the read loop for rapid acquisition in such read loop by adapting phase to data quickly within a PLL.

Bearing in mind the problems and deficiencies of the prior art, it is therefore an object of the present invention to provide an improved apparatus and method for controlling phase within a phase locked loop. Another object of the present invention is to provide an improved apparatus and method for outputting a fine phase in a read phase locked loop. Yet another object of the present invention is to provide an improved method and apparatus for decreasing the time required to achieve phase acquisition within a phase locked loop.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of controlling a variable phase in a phase locked loop. Preferably, the variable phase is controlled by providing an oscillator having a plurality of phases, wherein such plurality of phases have a first and second phase, providing a phase selector, inputting the first and second phases from the oscillator into the phase selector, and subsequently controlling the variable phase within a phase locked loop. In controlling the variable phase within the phase locked loop, the phase selector selects a desired phase among the variable phase between the first and second phases, thereafter such phase selector outputs the selected phase thereby controlling the variable phase within the phase locked loop. The oscillator of the present invention may comprise a single loop architecture.

The present embodiment of the invention may further comprise providing a timing signal, outputting the timing signal to a proportion-integral controller thereby generating a oscillator control signal, and outputting the oscillator control signal to the oscillator wherein the first and second phases employ the oscillator control signal generated by the timing signal to represent a timing error. In the present invention, such timing error may comprise a digital timing error.

Preferably, the oscillator of the present method of controlling a variable phase in a phase locked loop is a current controlled oscillator (ICO). In a preferred embodiment of the present invention, the oscillator has a frequency which is controlled by inputting a frequency input control into the oscillator. Wherein such frequency input control comprises proportional control, integral control or differential control. A preferred embodiment of the present invention may further include a first multiplexer having a digital control for selecting the first phase and a second multiplexer having a digital control for selecting the second phase. Furthermore, such first and second multiplexers having digital controls, the digital controls selecting one of the plurality of phases from the oscillator.

Preferably in the present invention, the first and second phases selected from the oscillator are adjacent phases within such oscillator.

In another preferred embodiment of the present invention the phase selector comprises a finite state machine, at least two multiplexers and a phase interpolator. In various embodiments of the present embodiment, the phase selector may have applied to it proportional control, integral control, differential control, and combinations thereof.

A preferred embodiment of the present invention may further comprise a write loop aligned to a reference clock and a read loop aligned to a continuous timing data signal, wherein the oscillator exists within both the write and read loops while the phase selector exists within the read loop. Furthermore, the write loop may be inactive while the read loop is active, therein the read loop acquiring timing data from a continuous timing data signal and a proportional controller in the read loop producing proportional control to the phase selector. Such an embodiment may further comprise a common integral control signal providing integral control to the oscillator, thereby producing proportional, integral, or differential control in the read loop to control phase of both the oscillator and phase selector.

Alternatively, the write and read loops may be simultaneously active, wherein the write loop is phase aligned to a reference clock while the read loop is phase aligned to the continuous timing data signal, thereby producing proportional, integral, or differential control in the write loop while simultaneously producing proportional, integral, or differential control in the read loop.

Preferably, the oscillator comprises N oscillator stages having 2N phase outputs wherein the phase selector comprises a digitally controlled fine interpolator having 12 states for interpolating phase between the first and second phases in equally spaced increments comprising $2\pi/96$ radians.

The phase interpolator may comprise first and second current weighted delays which are substantially inversely proportional to a control current wherein the phase interpolator inputs the first phase into the first delay stage while inputting the second phase into the second delay stage. Such first and second delay stages share a total current such that the digital control input causes a fraction F of the current I to flow to the control input of the first delay stage and a fraction (1−F) of the current I to flow to the control input of the second delay stage.

In another aspect, the present invention provides a phase locked loop for controlling a variable phase comprising an oscillator adapted to provide a plurality of phase outputs, a phase selector, a first and second phase outputs selected from the oscillator adapted to provide a plurality of phase outputs, and a phase locked loop. Such phase locked loop comprises the oscillator, phase selector, and first and second phase outputs, wherein the phase selector is adapted to output a desired variable phase selected among a variable phase between the first and second phase outputs from the oscillator, thereby the phase locked loop is adapted to control the variable phase. Preferably, the oscillator comprises a single loop architecture.

The above embodiment of the present invention may further comprise a timing signal, a proportional-integral controller adapted to generate from the timing signal an oscillator control signal; and a frequency generated by the oscillator, wherein the first and second phases of the oscillator are adapted to employ the oscillator control signal to generate the timing error. In the present invention, such timing error may comprise a digital timing error.

Such an embodiment of the present invention may further comprise a first multiplexer having a digital control adapted to select the first phase and a second multiplexer having a digital control adapted to select the second phase. The digital controls are adapted to select one of the plurality of phases from the oscillator.

Preferably, the phase selector comprises a finite state machine, at least two multiplexers and a phase interpolator.

The present embodiment may further comprise a write loop aligned to a reference clock and a read loop aligned to a continuous timing data signal, wherein the oscillator exists within both the write and read loops while the phase selector exists within the read loop.

Preferably, the oscillator comprises N oscillator stages having 2N phase outputs while the phase selector comprises a digitally controlled fine interpolator having 12 states for interpolating phase between the first and second phases in equally spaced increments comprising $2\pi/96$ radians.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
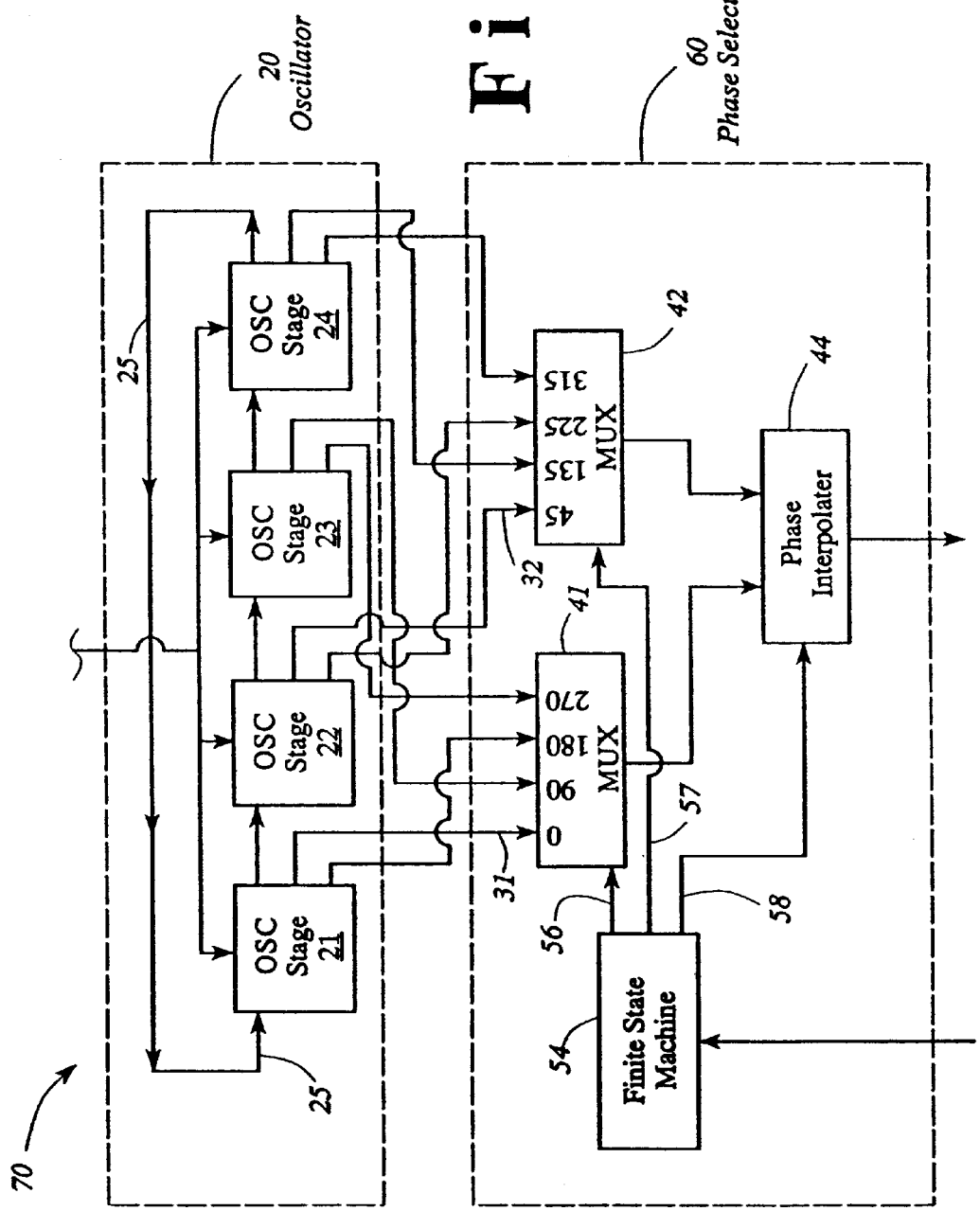
FIG. 1 illustrates a block diagram of the inventive oscillator having a plurality of oscillator stages with the phase selector for controlling digitally variable phase in a phase locked loop in accordance with the present invention.

In describing the preferred embodiment of the present invention, reference will be made herein to FIGS. 1–3 of the drawings in which like numerals refer to like features of the invention. Features of the invention are not necessarily shown to scale in the drawings.

The present invention provides an improved method and apparatus for independently controlling phase and frequency using an oscillator in combination with a phase selector within a digitally controlled phase-locked loop. The combined oscillator with the phase selector provides a digitally controlled variable phase of a read timing loop within a read phase locked loop in read channel integrated circuits associated with data storage devices. In a preferred embodiment, the present invention provides two separate controls, particularly a first control for phase and a second control for frequency. The phase and frequency are controlled independently of each other, wherein the first control, controlling phase, is applied to a phase selector, while the second control, controlling frequency, is applied to an oscillator, such as, a Current Controlled Oscillator (ICO), a Voltage Controlled Oscillator (VCO), and the like. Preferably in the present invention, the oscillator comprises an ICO.

The inventive combined oscillator having a plurality of oscillator stages with phase selector is illustrated in FIG. 1 by number 70. As shown, in a preferred embodiment, the phase selector 60 comprises at least a finite state machine 54, at least two multiplexers, 41 and 42, and a phase interpolator 44. The phase selector 60 further comprising each multiplexer having selection controls, as indicated by 56 and 57, and the phase interpolator having a select one of 12 phase controls, as indicated by 58. In such an embodiment, the phases from the ICO are combined together to provide a single phase output in the read loop selected from a range comprising at least $2\pi$ in phase increments of $27\pi/96$ radian. Furthermore, the phase selector 60 has a digitally controlled fine interpolator with a plurality of states for further fine interpolation between at least two multiplexer phase outputs to select a single phase output. Preferably, the digitally controlled fine interpolator has 12 fine states for further fine interpolation between at least two multiplexer phase outputs to select a single phase output in phase increments of $27\pi/96$ radian. In a preferred embodiment, the phase outputs from the multiplexers comprise phase inputs from at least two oscillator stages of an oscillator having N stages. In such an embodiment, the phases of the ICO are combined by the phase selector 60 to provide the single phase output in the read timing loop selected in phase increments of $2\pi/96$ radian within a phase locked loop in read channel integrated circuits associated with data storage devices.

In a preferred embodiment of the present invention, the phase selector 60 directly controls phase having gain independent of operating frequency. Such phase selector 60 controls phase by exact fractional increments of the operating frequency within the phase locked loop, therein such phase selector 60 controlling phase at all operating frequencies. The exact fractional increments comprise a plurality of equally spaced phases produced by delay stages existing between adjacent phases. Thus, the phase selector 60 controls phase by interpolating between the phases of successive delay stages from the pair of multiplexers, thereby controlling the digitally variable phase independently of frequency within the phase locked loop.

Furthermore, in controlling phase and frequency using a preferred embodiment of the present invention, the combined oscillator with the phase selector 60 allows frequency corrections to be applied to the oscillator through the current input, and phase corrections to be applied digitally to produce the phase output. Such frequency corrections may further comprise, for example, integral control in proportional-integral-differential (PID) controllers, differential control, and the like. The inventive combined oscillator with the phase selector 60 controls the read loop. In a preferred embodiment, the write loop is controlled, for example, by proportional control by analog current to the ICO, integral control by analog current to the ICO, and the like. The read loop is controlled, for example, by the ICO and the phase selector 60 each having at least one input control. In the present invention, the input control can be any combination of proportional (P), integral (I), and differential (D) control, or alternatively, proportional, integral, or differential control alone. Preferably, the read loop is controlled by proportional control and integral control going to at least one, or alternatively both, the ICO and/or the phase selector 60.

Figure 2:
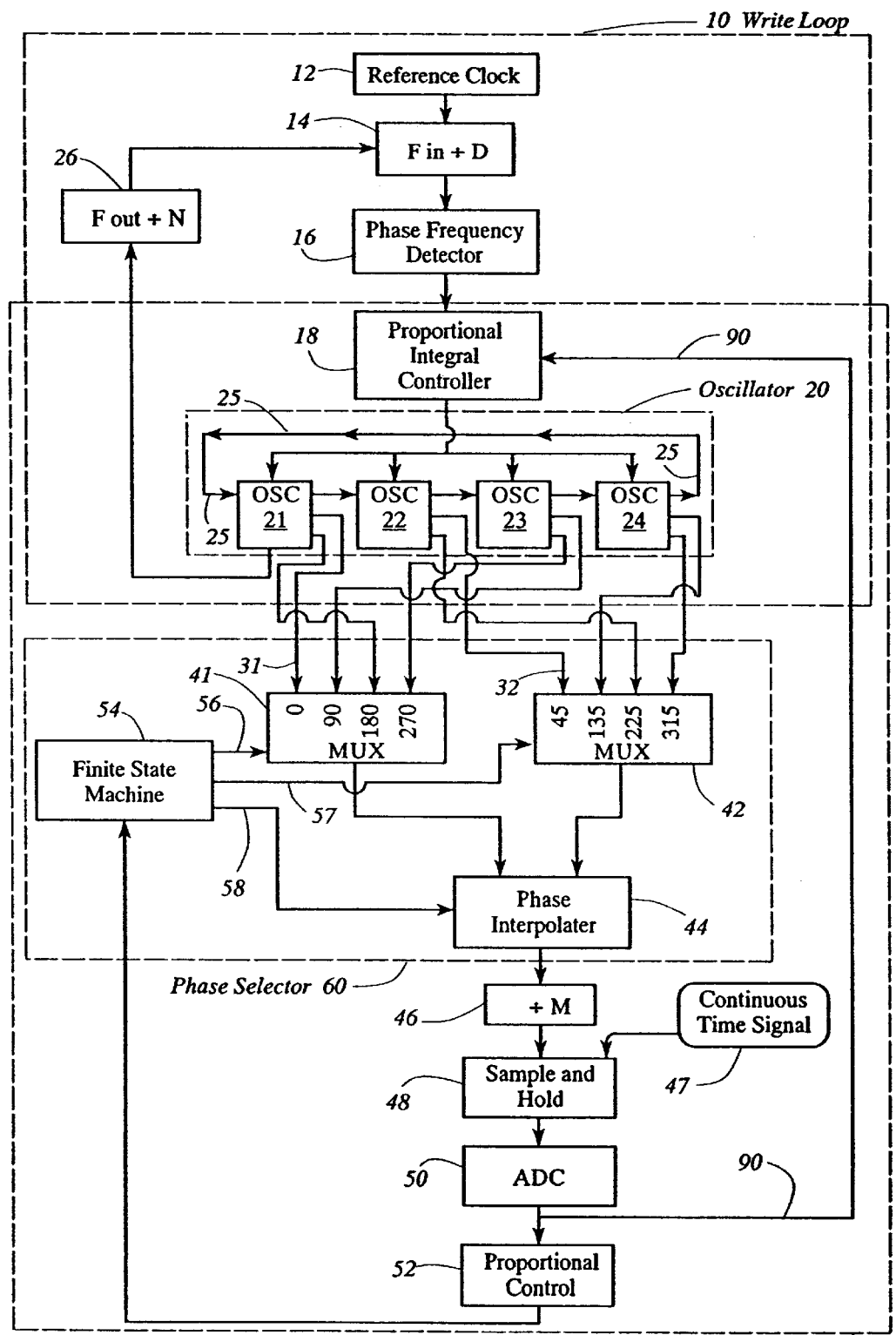
FIG. 2 illustrates a block diagram of the combined oscillator with phase selector within the phase locked loop for controlling digitally variable phase, therein the oscillator existing within both a write and a read loop and the phase selector existing within the read loop in accordance with the present invention.

FIGS. 1 and 2 show the inventive combined oscillator 20 with phase selector 60 within a phase locked loop, preferably a read phase locked loop 40, for providing a digitally controlled variable phase of the read timing loop in read channel integrated circuits associated with data storage devices. As illustrated in FIG. 2, the two modes of operation in data storage devices for controlling a system clock are write loop 10 and the read loop 40, wherein both comprise a phase locked loop. In a preferred embodiment of the present invention, the oscillator of the present invention exists within both write loop 10 and read loop 40, while the phase selector 60, comprising at least the finite state machine 54, the pair of multiplexers 41 and 42, and the phase interpolator 44, exists within the read loop 40. Thus the oscillator has an input for frequency control, and the phase selector 60 has an input for phase control of the oscillator outputs, thereby providing integral control to the oscillator and proportional control to the phase selector 60. Thus, the inventive combined oscillator with phase selector exists within the read phase locked loop to provide the digitally controlled variable phase of the read timing loop in read channel integrated circuits associated with data storage devices.

FIG. 2 illustrates, by a dotted line write loop 10 of a system clock. In a preferred embodiment of the present invention, write loop 10 is aligned to the output of an external reference clock 12, such as the output of a crystal oscillator, wherein the reference clock 12 has a predetermined frequency, by techniques known and used in the art. In such an embodiment, the synthesized frequency of oscillator 20 typically comprises a rational multiple, N/D (where N and D are integers) of reference clock 12. In synthesizing the frequency in writing loop 10, the frequency of reference clock 12 is divided by integer D to obtain an output of frequency-in of the reference clock divided by integer D, which subsequently is input into a phase-frequency detector 16. Also input into the phase-frequency detector 16 is a oscillator control of the oscillator 20 divided by integer N of the output clock. Thus, in a preferred embodiment, phase-frequency detector 16 is provided with a continuous timing signal comprising a first frequency 14, reference clock input frequency divided by integer D, and a second frequency 26, oscillator output frequency divided by integer N. See FIG. 2. The phase-frequency detector 16 compares the differences between such continuous timing signals of first frequency 14 to second frequency 26 by aligning transitions of the first and second frequencies, thereby determining a timing error by techniques known and used in the art. Subsequently, the timing error is output to a proportional-integral controller 18 to control the ICO. Preferably, such timing error is a digital timing error, wherein such digital timing error occurs between a reference signal and an output frequency signal.

Proportional-integral controller 18 processes the single phase output error determination of phase-frequency detector 16 by techniques known and used in the art. In the proportional-integral controller 18, oscillator 20, such as an ICO, controls frequency. Thus oscillator 20 has at least one frequency input control for controlling such frequency. In a preferred embodiment, oscillator control of the proportional-integral controller 18 is input into the plurality of oscillator stages of oscillator 20, thereby controlling the rate of oscillator 20 by either indicating a need to slow or increase the rate of such oscillator, thereby controlling frequency. Such frequency input control can be any combination of proportional (P), integral (I), and differential (D) control, or alternatively, proportional, integral, or differential control alone. Furthermore, the frequency control of proportional-integral controller 18 is input into the oscillator 20 having a plurality of stages, wherein there are N number of such oscillator stages having 2N phases, therebetween two adjacent oscillator phases existing a delay stage, wherein the oscillator stages of oscillator 20 comprise a ring oscillator 25. In write loop 10, specified data is obtained and written to a magnetic medium at the synthesized frequency, one binary bit of data per cycle, wherein the magnetic medium may comprise, for example, a hard drive, a digital communication system, and the like.

FIG. 2 further illustrates read loop 40 of the system clock by a dotted line. In read loop 40, data is read from the recorded magnetic medium at the same rate it is recorded in write loop 10. In read loop 40, phases from adjacent oscillator stages in the plurality of oscillator stages are input into a first multiplexer 41 and a second multiplexer 42. In a preferred embodiment of the invention, the plurality of oscillator stages of oscillator 20 comprise n=4 oscillator stages having 2N=8 phase outputs of such 4 oscillator stages. As illustrated, the 4 oscillator stages of oscillator 20 comprise a first oscillator stage 21, a second oscillator stage 22, a third oscillator stage 23, and a fourth oscillator stage 24. The pair of multiplexers obtain phase data from the oscillator stages of oscillator 20 by, for example, a first phase 31, from the first oscillator stage 21, being input to the first multiplexer 41 and a second phase 32, from the second oscillator stage 22, which is adjacent to such first oscillator stage 21, being input to the second multiplexer 42. The first and second phase inputs of multiplexers 41 and 42 are subsequently output to a phase interpolator 44 for further interpolation between the two phases to provide a single phase output which is selected among 12 fine steps between first phase input 31 and second phase input 32. Preferably, the 12 fine steps are selected from a variable, digital phase in increments of $2\pi/96$ radians. The single phase output is divided by an integer "M" as indicated by 46 in FIG. 2, and subsequently input into a sample and hold 48. Continuous time signal data 47 is further provided to sample and hold 48 from a data storage device, such as, a hard drive, magnetic tape, and the like. Therein, the read loop 40 is aligned to the continuous time signal data 47. The data from sample and hold 48 is then digitized through an analog to digital converter (ADC) 50, and subsequently controlled by a proportional control 52. The controlled, digitized data from proportional control 52 is then input into a finite state machine 54. The finite state machine 54 provides control logic to multiplexers 41 and 42 and phase interpolator 44 for further interpolation between the pair of a selected phases 31 and 32, therein specifying a desired phase.

As illustrated in FIG. 2, in a preferred embodiment of the invention, write loop 10 may be inactive, while the read loop 40 is aligned to the continuous time data signal 47. In such an embodiment the read loop acquires timing data from the data signal 47 and controller 52 produces proportional control to the phase selector 60. Additionally, a common integral control signal 90 from the read loop allows controller 18 to produce integral control to oscillator 20. In such embodiment, the write loop 10 is inactive producing neither proportional, integral, nor differential control. However, any combination of proportional, integral and differential control can be produced by read loop 40 to control phase of both the oscillator 20 and the phase selector 60.

In another embodiment of the present invention write loop 10 and read loop 40 may be simultaneously active. In such an embodiment, the write loop 10 is phase aligned to the reference clock 12 while the read loop 40 is phase aligned to the data stream 47. Preferably, common integral control signal 90 from the read loop is absent from such an embodiment. The PID controller 18 of write loop 10 produces proportional, integral and differential control, and combinations thereof, applied to current controlled oscillator 20, while simultaneously proportional controller 52 of the read loop 40 produces proportional, integral and differential control, and combinations thereof, applied to phase selector 60 to control phase.

Figure 3:
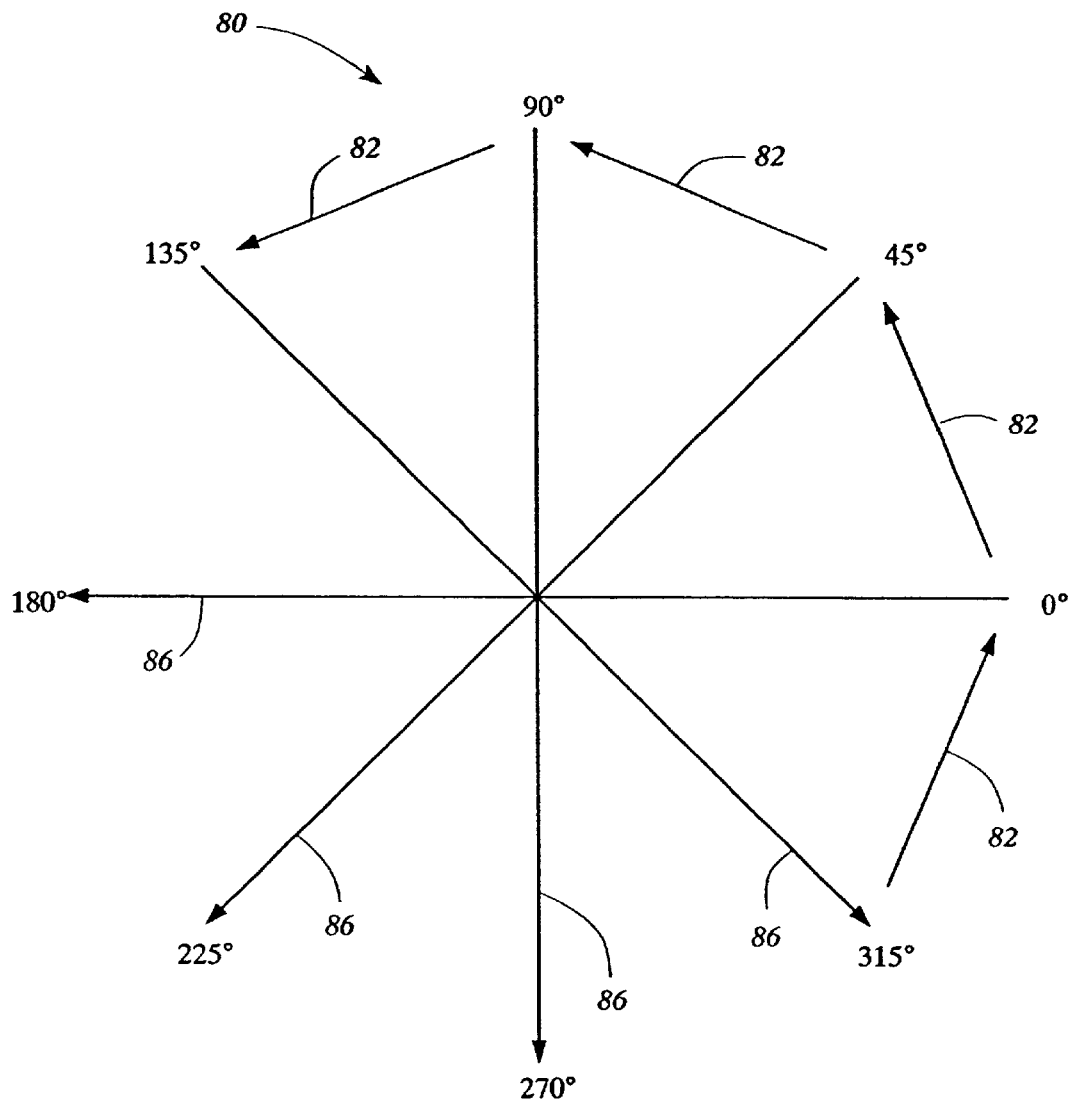
FIG. 3 illustrates a phase diagram of the oscillator in accordance with the present invention having 4 oscillator stages with 2N phases, or 8 phase outputs, wherein such 8 phase outputs exist at 0, 45, 90, 135, 180, 225, 270, and 315 degrees with delay stages existing therebetween adjacent phases.

As illustrated in FIGS. 2 and 3, and discussed above, preferably there are N oscillator stages of oscillator 20 having 2N phase outputs of such oscillator stages. In a preferred embodiment, N=4, thus there are 4 oscillator stages having 2N=8 phase outputs of the 4 oscillator stages. Such 8 phase outputs of the 4 oscillator stages are equally spaced. The 8 phase outputs of the oscillator stages of oscillator 20 comprise a full $2\pi$ radian, or 360 degrees, thereby phase locking incoming data. See FIG. 3. In a preferred embodiment, the 8 phase outputs of the oscillator stages of oscillator 20 are 45 degrees apart from each other. Thus, in an embodiment having N=4 oscillator stages with 2N=8 phase outputs of such oscillator stages, the phase outputs may comprise 0, 45, 90, and 135 degrees for the 4 oscillator stages with each of the 4 oscillator stages having complementary stages at 180, 225, 270, and 315 degrees, respectively. As illustrated in FIG. 3, the 8 phase outputs simulate a phase diagram 80 totaling the $2\pi$ radian, or 360 degrees, of the oscillator having phases at 0, 45, 90, 135, 180, 225, 270, and 315 degrees. In phase diagram 80, phases between the 4 oscillator stages are illustrated by number 82. Such phases 82 are created by the delay stages of the 4 oscillator stages. In a preferred embodiment, such delay stages are produced at 45 degree intervals. Furthermore as illustrated in FIG. 3, a plurality of 180 degree lines 86 represent the out-of-phase outputs of such delay stages, wherein such out-of-phase outputs are differential.

Furthermore, phase diagram 80 illustrates the phase outputs of the 4 oscillator stages, wherein the delay stages are digitally integrated into the oscillator to provide controlled alignment of the oscillator stages. Thus in a preferred embodiment, wherein there are 4 oscillator stages with 8 phase outputs comprising 0, 45, 90, and 135 degrees and 180, 225, 270, and 315 degrees, a first oscillator stage comprises phases at 0 and 180 degrees, a second oscillator stage comprises phases at 45 and 225 degrees, a third oscillator stage comprises phases at 90 and 270 degrees, and a fourth oscillator stage comprises phases at 135 and 315 degrees. Therein, the 180, 225, 270, and 315 degrees are the out-of-phase outputs of such oscillator stages. Furthermore, preferably the first oscillator stage is adjacent the second oscillator stage, which is adjacent to the third oscillator stage, which in turn is adjacent to the fourth oscillator stage.

Subsequently, a desired pair of delay stages having phase outputs are selected by multiplexers 41 and 42 having digital controls for selecting any two adjacent delay stages from among the 2N phases of the oscillator, wherein the phase outputs are 45 degrees out from selected adjacent delay stages of the oscillator. Preferably, the first delay stage has a first phase output which is input into multiplexer 41 and the second delay stage has a second phase output which is input into multiplexer 42. The phase outputs of the delay stages input into multiplexers 41 and 42 are further output to phase interpolator 44, therein the phase interpolator 44 averaging the two phase outputs to provide a single phase output of the phase interpolator 44. Thus the inventive combined oscillator with the phase selector allows further interpolation between a pair of selected phase outputs over a digitally-variable phase, thereby controlling such phase.

The pair of phase outputs are interpolated by phase interpolator 44, therein phase interpolator 44 providing the advantage of controlling phase from the oscillator stages by further interpolating among 12 fine steps between such phase outputs. In a preferred embodiment, the two phase outputs of the oscillator stages provided to the phase selector 60 may further be divided into 12 fine steps, thus providing a total of 96 steps (8 phases times 12 steps) per $2\pi$, radians in the oscillator of the present invention. Preferably, the phase can be incremented in an unlimited amount in either direction in single or multiple units of $2\pi/96$. In a preferred embodiment, wherein phase outputs are selected at 0 and 45 degrees, phase selector 60 allows the phase to be further interpolated, thereby selecting and providing a phase output of the read loop among 12 fine steps between 0 and 45 degrees.

In phase selector 60, the finite state machine 54 provides the logic to specify which of the 96 phases to select and subsequently sends such selected data to the phase interpolator 44 and multiplexers 41 and 42 by a digital signal for selecting phases. In the present invention, each multiplexer has a digital control signal, wherein multiplexer 41 has digital control signal 56 and 4 phase inputs from the oscillator, while multiplexer 42 has digital control signal 57 and 4 phase inputs from the oscillator. See FIG. 2. Such digital control signals are selected by the finite state machine. In the digital control signals 56 and 57, each multiplexer is capable of selecting one of 4 phase inputs, therein the digital control signals 56 and 57 indicate which of the four input signals are selected as outputs from the pair of multiplexers. The output digital control signals 56 and 57 are sent to the pair of multiplexers, wherein the multiplexer outputs are connected to the phase interpolator 44.

The phase interpolator 44 preferably has a select one of 12, wherein such select one of 12 selects the desired fine step between the pair of adjacent phases, as shown by number 58, wherein the phase interpolator 44 has a digitally controlled fine interpolator with 12 states for resolving the phase between multiplexers 41 and 42 in equally spaced increments of $2\pi/96$ radians. See FIG. 2. The interpolator of the present invention further has two current weighted delay stages or signals for selecting the phases. Such two delay stages, each having a delay approximately inversely proportional to the control current. Furthermore, each of the delay stages in the phase interpolator share a total current I such that the digital control input causes a fraction F of the current I to flow to the control input of the first delay stage and a fraction (1−F) of the current I to flow to the control input of the second delay stage, wherein the control select one of 12 input into the interpolator 44 controls such fractions of current into the first and second stages to provide the single phase output of phase interpolator 44. Therefore, the phase selector provides a second control for controlling phase independently of the oscillator which provides the first control for controlling frequency.

Thus, the above invention has been found to achieve the objects recited above. The present inventive combined oscillator with the phase selector for providing a digitally controlled variable phase of a read timing loop within a phase locked loop in read channel integrated circuits associated with data storage devices has improved accuracy and control of phase, in addition to providing improved precision of interpolating between at least two phase output selections to provide a fine phase selection between such phases. In a preferred embodiment, the present invention interpolates between a first phase and a second phase to provide a third phase comprising a phase selected among 12 fine steps between the first and second phase. The present combined oscillator with the phase selector provides improved precision of phase control and selection by allowing further selection among 12 fine steps between the first and second phase over a $2\pi$ radian range having 96 selectable phases.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of controlling a variable phase in a phase locked loop comprising:

providing an oscillator; said oscillator having a plurality of phases, therein having first and second adjacent phases;

providing a phase selector;

inputting said first and second adjacent phases from said oscillator into said phase selector;

controlling a variable phase wherein said phase selector selects a desired phase among said variable phase between said fist and second adjacent phases, said phase selector outputting the selected phase within a phase locked loop thereby controlling said variable phase with the phase locked loop;

providing a timing signal;

outputting said timing signal to a proportional-integral controller thereby generating an oscillator control signal; and outputting said oscillator control signal to said oscillator wherein said first and second phases employ the oscillator control signal generated by said timing signal to represent a timing error.

2. The method according to claim 1 wherein said timing error comprises a digital timing error.

3. A method of controlling a variable phase in a phase locked loop comprising:

providing an oscillator having a plurality of phases and a frequency;

providing a phase selector;

inputting first and second adjacent phases from the plurality of phases into said phase selector;

inputting a frequency input into the oscillator for controlling the frequency of the oscillator, the frequency input comprising proportional, integral and differential control; and controlling a variable phase wherein said phase selector selects a desired phase among said variable phase between said first and second adjacent phases, the phase selector outputting the selected phase whithin a phase locked loop thereby controlling the variable phase within the phase locked loop.

4. A method of controlling a variable phase in a phase locked loop comprising:

providing an oscillator having a plurality of phases;

providing a phase selector;

providing proportional, integral and differential signals;

controlling the phase selector with at least one of the above signals;

inputting a first and second adjacent phases of the plurality of phases into the phase selector;

controlling a variable phase wherein the phase selector selects a desired phase among the variable phase between the first and second phases, the phase selector outputting the selected phase within a phase locked loop thereby controlling the variable phase within the phase locked loop.

5. A method of controlling a variable phase in a phase locked loop comprising:

providing an oscillator having a plurality of phases;

providing a phase selector;

inputting first and second adjacent phases of the plurality of phases into the phase selector; controlling a variable phase wherein the phase selector selects a desired phase among the variable phase between the first and second adjacent phases, the phase selector outputting the selected phase within a phase locked loop thereby controlling the variable phase within the phase locked loop; and a write loop aligned to a reference clock and a read loop aligned to a continuous timing data signal, wherein said oscillator exist within both said write and read loops while said phase selector exists within said read loop.

6. A method of controlling a variable phase in a phase locked loop comprising:

providing an oscillator having a plurality of phases;

providing a phase selector having a digitally controlled fine interpolator having 12 states for interpolating phase between first phase and second adjacent phases of the plurality of phases in equally spaced increments comprising $2\pi/96$ radians;

inputting the first phase into the phase selector;

inputting the second phase into the phase selector; and controlling a variable phase wherein the phase selector selects a desired phase among the variable phase between the first and second phases, the phase selector outputting the selected phase within a phase locked loop thereby controlling the variable phase within the phase locked loop.

7. A method of controlling a variable phase in a phase locked loop comprising:

providing an oscillator having a plurality of phases;

providing a phase selector;

inputting first and second adjacent phases of the plurality of phases into the phase selector;

a phase interpolator comprising first and second current weighted delay having delays substantially inversely proportional to a control current wherein said phase interpolator inputting said first adjacent phase into said first delay stage while inputting said second adjacent phase into said second delay stage, said first and second delay stages sharing a total current such that the digital control input causes a fraction F of the current I to flow to the control input of the first delay stage and a fraction (1−F) of the current I to flow to the control input of the second delay stage; and controlling a variable phase wherein the phase selector selects a desired phase among the variable phase between the first and second adjacent phases, the phase selector outputting the selected phase within a phase locked loop thereby controlling the variable phase within the phase locked loop.

8. A phase locked loop for controlling a variable phase comprising:

an oscillator adapted to provide a plurality of phase outputs;

a phase selector;

a first and a second phase output from the plurality of phase outputs, the first and second phases being adjacent phases selected from the oscillator;

a timing signal;

a proportional integral controller adapted to generate from the timing signal an oscillator control signal;

a timing error generated by the oscillator, wherein the first and second phases are adapted to employ the oscillator control signal to generate the timing error, and a phase locked loop comprising the oscillator, phase selector, and first and second adjacent phase outputs, adapted to control a variable phase, wherein the phase selector is adapted to output a desired variable phase selected among a variable phase between the first and second adjacent phase outputs, thereby the phase locked loop is adapted to control the variable phase.

9. A phase locked loop for controlling a variable phase comprising:

an oscillator adapted to provide a plurality of phase outputs;

a phase selector;

a first and second phase output from the plurality of phase outputs, the first and second phase outputs being adjacent phases selected from the oscillator;

a write loop aligned to a reference clock and a read loop aligned to a continuous timing data signal, wherein the oscillator exists within both the write and read loops while the phase selector exists within the read loop; and a phase locked loop comprising the oscillator, phase selector, and first and second adjacent phase outputs, adapted to control a variable phase, wherein the phase selector is adapted to output a desired variable phase selected among a variable phase between the first and second adjacent phase outputs, thereby the phase locked loop is adapted to control the variable phase.

10. The method according to claim 5 wherein said write loop is inactive while said read loop is active, said read loop acquiring timing data from said continuous timing data signal and a proportional controller in said read loop producing proportional control to said phase selector.

11. The method according to claim 10 further comprising a common integral control signal providing integral control to said oscillator, thereby producing proportional, integral, or differential control in said read loop to control phase of both said oscillator and phase selector.

12. The method according to claim 5 wherein said write and read loops are simultaneously active, said write loop is phase aligned to said reference clock while said read loop is phase aligned to said continuous timing data signal thereby producing proportional, integral, or differential control in said write loop while simultaneously producing proportional, integral, or differential control in said read loop.

13. The phase locked loop according to claim 8 wherein said timing error comprises a digital timing error.

* * * * *